(12) United States Patent
Kim et al.

(10) Patent No.: US 8,795,929 B2
(45) Date of Patent: Aug. 5, 2014

(54) PELLICLE HAVING BUFFER ZONE AND PHOTOMASK STRUCTURE HAVING PELLICLE

(75) Inventors: Sung-Hyuck Kim, Yongin-si (KR); In-Kyun Shin, Yongin-si (KR); Bum-Hyun An, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 72 days.

(21) Appl. No.: 13/549,895

(22) Filed: Jul. 16, 2012

(65) Prior Publication Data

US 2013/0089814 A1    Apr. 11, 2013

(30) Foreign Application Priority Data

Oct. 7, 2011    (KR) .................. 10-2011-0102665

(51) Int. Cl.
*G03F 1/00*    (2012.01)

(52) U.S. Cl.
USPC ............................................. 430/5; 428/14

(58) Field of Classification Search
USPC ................................................ 430/5; 428/14
See application file for complete search history.

(56) References Cited

U.S. PATENT DOCUMENTS

| 5,814,381 | A | * | 9/1998 | Kuo .............................. 428/14 |
| 7,968,252 | B2 | | 6/2011 | Shirasaki et al. |
| 8,221,945 | B2 | * | 7/2012 | Shirasaki et al. ............. 430/5 |
| 8,293,432 | B2 | * | 10/2012 | Sekihara ......................... 430/5 |
| 8,323,855 | B2 | * | 12/2012 | Miyakawa et al. ............. 430/5 |
| 8,435,703 | B2 | * | 5/2013 | Sekihara ......................... 430/5 |
| 8,445,165 | B2 | * | 5/2013 | Hamada ......................... 430/4 |
| 2008/0213679 | A1 | * | 9/2008 | Miyakawa et al. ............. 430/5 |
| 2010/0323281 | A1 | * | 12/2010 | Sekihara ......................... 430/5 |
| 2010/0330467 | A1 | * | 12/2010 | Shirasaki et al. ............. 430/5 |
| 2011/0063601 | A1 | * | 3/2011 | Kim et al. ...................... 355/75 |

FOREIGN PATENT DOCUMENTS

| JP | 2004-294786 | 10/2004 |
| JP | 2009-063740 | 3/2009 |
| JP | 2011-007935 | 1/2011 |
| KR | 10-2005-0068967 A | 7/2005 |
| KR | 10-2007-0087968 A | 8/2007 |
| KR | 10-2009-0025140 A | 3/2009 |
| KR | 10-2010-0138822 A | 12/2010 |

OTHER PUBLICATIONS

Maejima et al.—Approximate method of mask flatness factor in focus deviation, SPIE vol. 6283, pp. A1-A9.

* cited by examiner

*Primary Examiner* — Stewart Fraser
(74) *Attorney, Agent, or Firm* — Lee & Morse, P.C.

(57) ABSTRACT

A pellicle including a frame having a square shape; and a buffer zone in the frame, the buffer zone dividing a lower surface of the frame into a plurality of portions.

17 Claims, 19 Drawing Sheets ps
PELLICLE HAVING BUFFER ZONE AND PHOTOMASK STRUCTURE HAVING PELLICLE

CROSS-REFERENCE TO RELATED APPLICATION

This application claims priority under 35 U.S.C. §119 to Korean Patent Application No. 10-2011-0102665 filed on Oct. 7, 2011, the disclosure of which is hereby incorporated by reference in its entirety.

BACKGROUND

1. Field

Example embodiments relate to a pellicle having a buffer zone and a photomask structure having the pellicle.

2. Description of Related Art

A pellicle serves as a means to protect an optical pattern formed on a photomask. The pellicle has a rigid frame. As such, the pellicle can provide physical pressure to the photomask and influence evenness of the photomask when in contact with the photomask.

SUMMARY

One or more embodiments may provide a pellicle including: a frame having a square shape; and a buffer zone in the frame, the buffer zone dividing a lower surface of the frame into a plurality of portions.

The buffer zone may include an opening in a portion of the lower surface of the frame. The buffer zone may include an opening in an outer surface of the frame. The buffer zone may include an opening in an inner surface of the frame. The opening of the buffer zone may not extend to an upper surface of the frame. The frame may include at least four sides, the buffer zone being in at least one of the sides. The buffer zone may be in two or more of the sides. The frame may include corner portions, the buffer zone being in at least one of the corner portions. The buffer zone may be in two or more of the corner portions. The frame may include a through hole. The buffer zone may be I-shaped. The pellicle may further include: a lower adhesive member on the lower surface of the frame; an upper adhesive member on an upper surface of the frame; and a membrane formed on the upper adhesive member. The pellicle may further include: a capturing film having adhesion, the capturing film being in an inner surface of the frame. The pellicle may further include a filter on an outer surface of the frame, the filter covering the buffer zone.

One or more embodiments may provide a photomask structure, including: a photomask including an optical pattern thereon; and a pellicle mounted on the photomask and covering the optical pattern, the pellicle including a frame and a buffer zone, the buffer zone having an opening in a lower surface of the frame.

One or more embodiments may provide a pellicle, including: a generally rectangular frame including a first pair of parallel sides extending between and second pair of parallel sides, the first pair of parallel sides and the second pair of parallel sides intersecting at corner portions; and one or more buffer zones in the frame, the one or more buffer zones including an opening in a lower surface of the frame. The one or more buffer zones may be in one or more sides of the frame. The one or more buffer zones may be in one or more corners of the frame. The opening of the one or more buffer zones may extend through an inner surface and an outer surface of the frame. The opening of the one or more buffer zones may extend through an inner surface or an outer surface of the frame.

BRIEF DESCRIPTION OF THE DRAWINGS

Features will become apparent to those of ordinary skill in the art by describing in detail an embodiment with reference to the attached drawings in which.

DETAILED DESCRIPTION

Figure 1A:
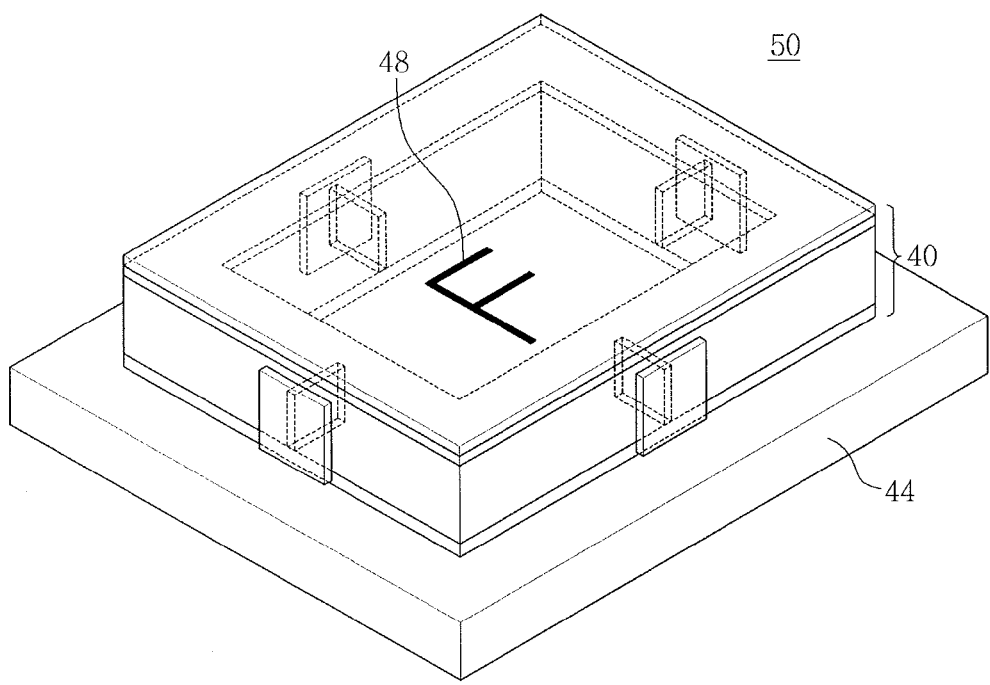
FIG. 1A illustrates a perspective view of a photomask structure according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Various embodiments will now be described more fully with reference to the accompanying drawings in which some embodiments are shown. However, specific structural and functional details disclosed herein are merely representative for purposes of describing an embodiment. Thus, the embodiments may be embodied in many alternate forms and should not be construed as limited to only an embodiment set forth herein. Therefore, it should be understood that there is no intent to limit an embodiment to the particular forms disclosed, but on the contrary, an embodiment are to cover all modifications, equivalents, and alternatives falling within the scope of the embodiments.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that, if an element is referred to as being "connected" or "coupled" with another element, it can be directly connected, or coupled, to the other element or intervening elements may be present. In contrast, if an element is referred to as being "directly connected" or "directly coupled" with another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, the embodiments should not be construed as limited to the particular shape illustrated herein but may include deviations in shapes that result, for example, from manufacturing. For example, a buffer zone in a frame may be shaped like a channel or a trench rather than a slit, when being viewed in a top view. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe the embodiments, various aspects will be described in detail with reference to the attached drawings. However, the embodiments are not limited to the embodiments described.

Figure 1B:
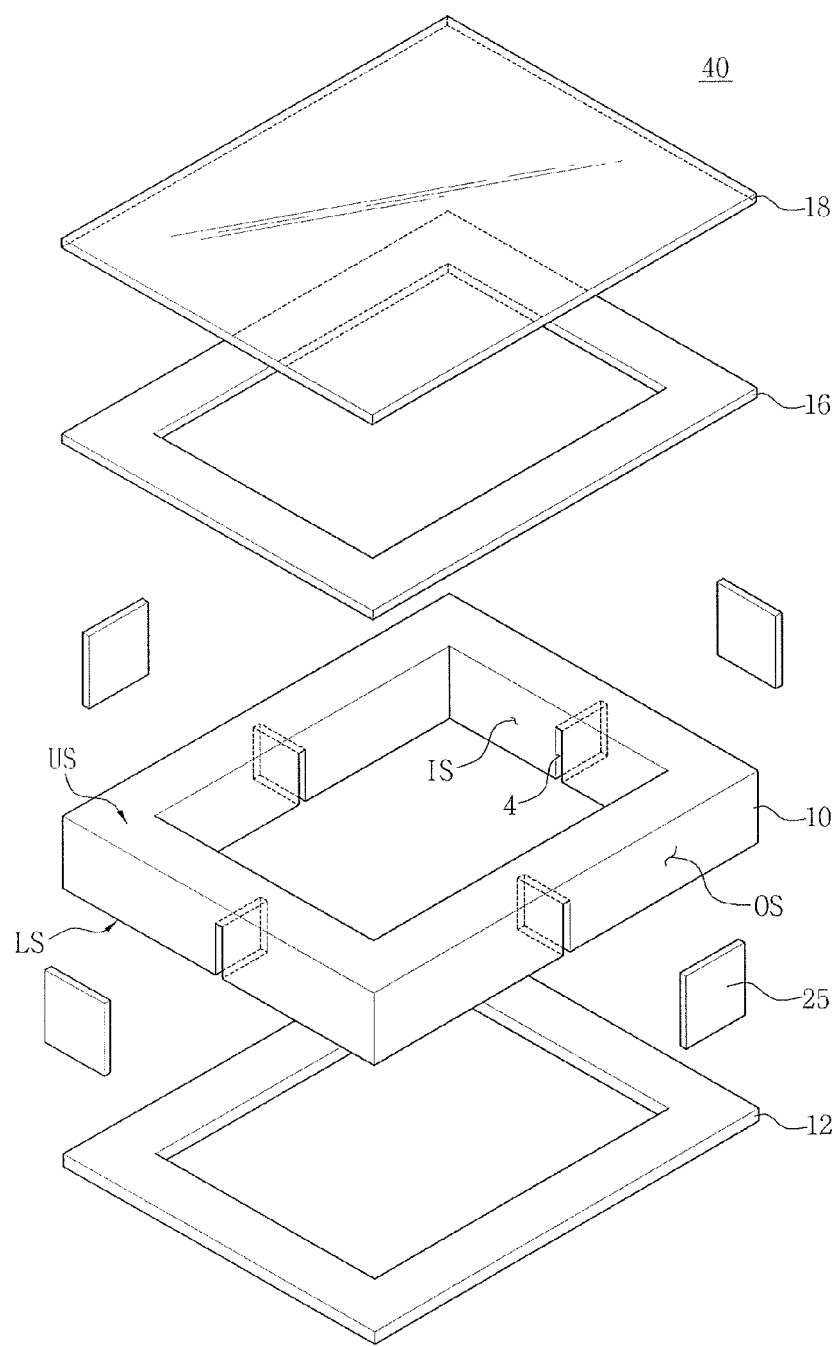
FIG. 1B illustrates an exploded perspective view of a pellicle according to an embodiment.

FIG. 1A illustrates a perspective view of a photomask structure 50 according to an embodiment. FIG. 1B illustrates an exploded perspective view of a pellicle 40 according to an embodiment.

Referring to FIGS. 1A and 1B, the photomask structure 50 according to an embodiment may include the pellicle 40 and a photomask 44 as shown in FIG. 1A. The pellicle 40 may be located on the photomask 44. The photomask 44 may include a quartz substrate and a material layer on the quartz substrate. The quartz substrate may be optically transparent, and the material layer may be optically opaque or semitransparent.

For example, the material layer may include chromium (Cr), aluminum (Al), molybdenum (Mo), silicon (Si) or an oxide compound thereof. An optical pattern 48 including the material layer may be disposed on a surface of the photomask 44. At least a portion of the surface of the photomask 44 may be covered by the pellicle 40. The pellicle may confine and protect the photomask 44. The pellicle 40 may include a frame 10, as shown in FIG. 1B.

The frame 10 may have various shapes. According to some embodiments, as described herein, the frame 10 may have a square shape. The frame 10 may include a metal, such as aluminum (Al), a high molecular weight polymer, such as acryl, a carbonate polymer, or other suitable materials. In an implementation, the frame 10 may include four sides 2 and four corner portions 3 (see FIG. 2A).

The sides 2 may include an inner surface IS, an outer surface OS, a lower surface LS and an upper surface US. The pellicle 40 may include a lower adhesive member 12 disposed on the lower surface LS of the frame 10, an upper adhesive member 16 disposed on the upper surface US of the frame 10, and a membrane 18 disposed on the upper adhesive member 16, as shown in FIG. 1B.

Figure 3A:
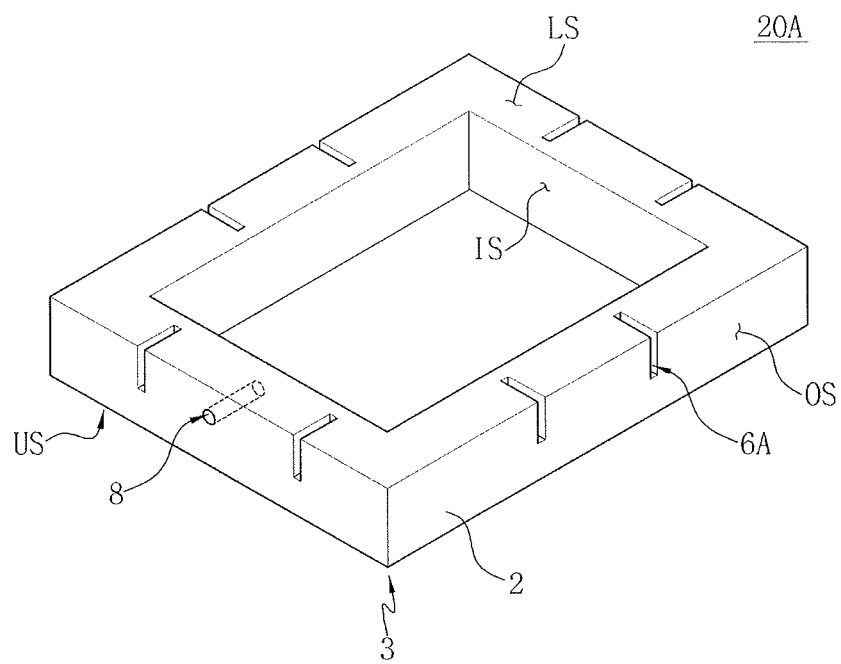

The sides 2 may include buffer zones 4, as shown in FIG. 1B. The buffer zone 4 may be shaped like a slit or a groove. For example, the buffer zones 4 may be a slit, as shown in FIG. 1B, or a groove, as shown in FIG. 3A. According to some embodiments, the groove may have various shapes, as described below. The term 'slit' may refer to an opening within one or more of the sides 2 that penetrates the inner surface IS and the outer surface OS of the frame 10 or the pellicle 40. The term 'groove' may refer to an opening in one or more of the sides 2 that does not penetrate both the inner surface IS and the outer surface OS of the frame 10 or the pellicle 40.

According to some embodiments, slit-type buffer zones 4 may completely replace predetermined portions of the lower surface LS and predetermined portions of the inner surface IS and the outer surface OS. With respect to the slit-type buffer zones 4, the predetermined portions of the inner surface IS and the outer surface OS may extend to the lower surface LS, but may not extend to the upper surface US. According to some embodiments, groove-type buffer zones 4 may replace predetermined portions of the lower surface LS and the inner surface IS or predetermined portions of the lower surface LS and the outer surface OS. With respect to the groove-type buffer zones 4, the predetermined portions of the lower surface LS may extend to one of the inner surface IS and the outer surface OS. Also, the predetermined portions of the inner surface IS and the outer surface OS in the groove-type buffer zones 4 may extend to the lower surface LS, but may not extend to the upper surface US. The lower adhesive member 12 may be provided in the form of a film on the lower surface LS of the frame 10. The lower adhesive member 12 may adhere and fix the frame 10 to the surface of the photomask 44 of FIG. 1A.

The upper adhesive member 16 may be provided in the form of a film on the upper surface LS of the frame 10. The upper adhesive member 16 may adhere and fix the membrane 18 to the upper surface US of the frame 10. The membrane 18 may be provided in the form of a transparent or semitransparent thin film. The membrane 18 may cover and seal off a portion of the photomask 44 surrounded by the frame 10.

Filters 25 may be disposed on the outer surface OS of the sides 2 as shown in FIG. 1B. The filters 25 may cover the buffer zones 4, respectively. The filters 25 may contact the lower adhesive member 12, e.g., a lower edge of the filters 25 may contact an upper surface of the lower adhesive member 12. The filters 25 may shield and prevent entry of a particle or a radical, for example, from an exterior of the pellicle 40 to an interior of the pellicle 40.

FIGS. 1A and 1B illustrate a detailed example of one of various embodiments. It should be understood that the frame 10 shown in FIG. 1B may be substituted by any one of the frames illustrated in FIGS. 2A to 2J, 3A to 3L and 4A to 4C. Hereinafter, specific embodiments according to the inventive concepts will be shown and described in detail.

Figure 2A:
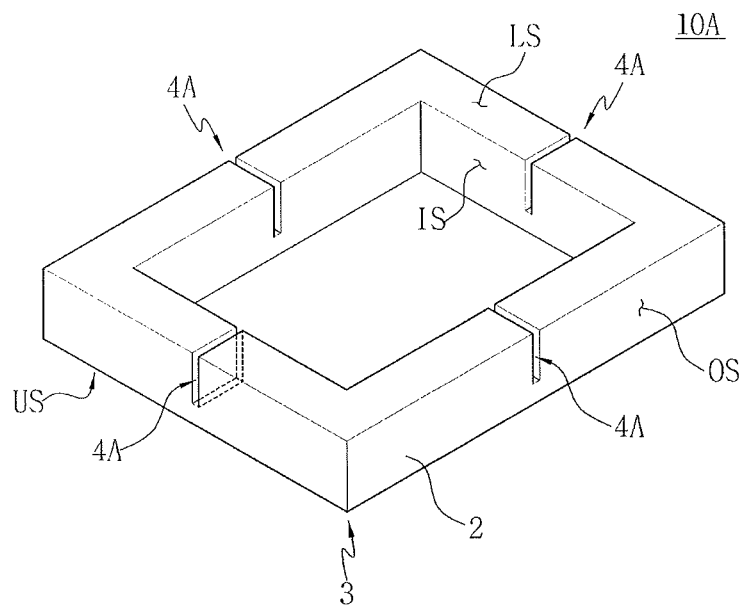
FIGS. 2A to 4C illustrate perspective views of frames according to an embodiment.

FIG. 2A illustrates a perspective view of a frame 10A according to an embodiment. To facilitate a better understanding, FIG. 2A shows a lower surface LS of the frame 10A.

Referring to FIG. 2A, the frame 10A may include first buffer zones 4A respectively formed in the sides 2 thereof. The first buffer zones 4A may be an I-shaped slit. For example, the first buffer zones 4A may have an 'I' or '-' shape, and may penetrate the inner surface IS of the sides 2 and the outer surface OS of the sides 2.

The first buffer zones 4A may replace portions of the lower surface LS of the sides 2, thereby dividing the lower surface LS into a plurality of portions. For example, each of the sides 2 may be separated into two portions by the first buffer zones 4A. Portions of an upper surface US of the sides 2 may not be replaced by the first buffer zones 4A. Also, the first buffer zones 4A may be selectively formed only in one to three of the sides 2, e.g., no more than three of the sides 2. As described above, the buffer zones 4A may divide the lower surface LS of the sides 2 into the plurality of portions. As such, the buffer zones 4A may provide the frame 10A with flexibility. Accordingly, the first buffer zones 4A may disperse pressure that may be applied to the surface of the photomask 44 of FIG. 1A by the frame 10A and, thereby, maintain an evenness of the surface of the photomask 44. Because of the first buffer zones 4A, the frame 10A may not cause deterioration of the evenness of the surface of the photomask 44. As a result, the frame 10A may adhere more closely to the surface of the photomask 44.

Figure 2B:
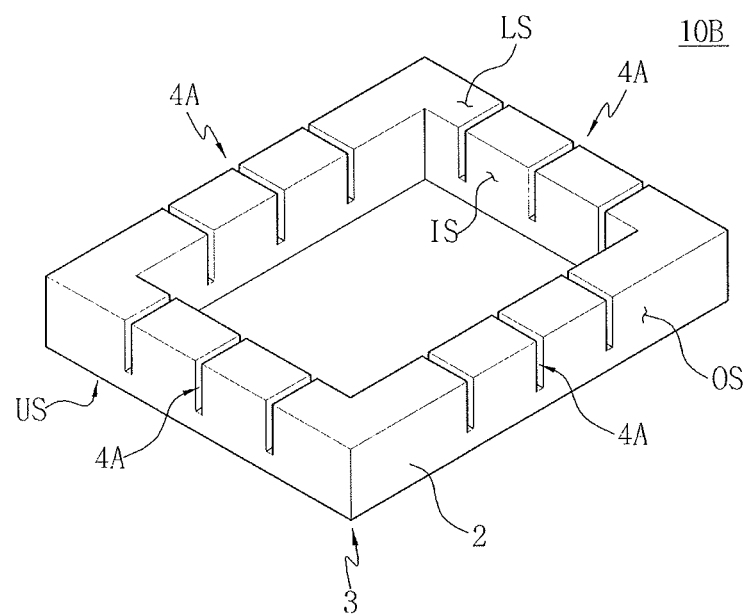

FIG. 2B illustrates a perspective view of a frame 10B according to an embodiment.

Referring to FIG. 2B, the frame 10B may include a plurality of first buffer zones 4A formed in sides 2. In detail, each of the sides 2 may include two or more first buffer zones 4A. In this case, the first buffer zones 4A may divide a lower surface LS into a plurality of portions. For example, each of the sides 2 may be divided into three or more portions.

Figure 2C:
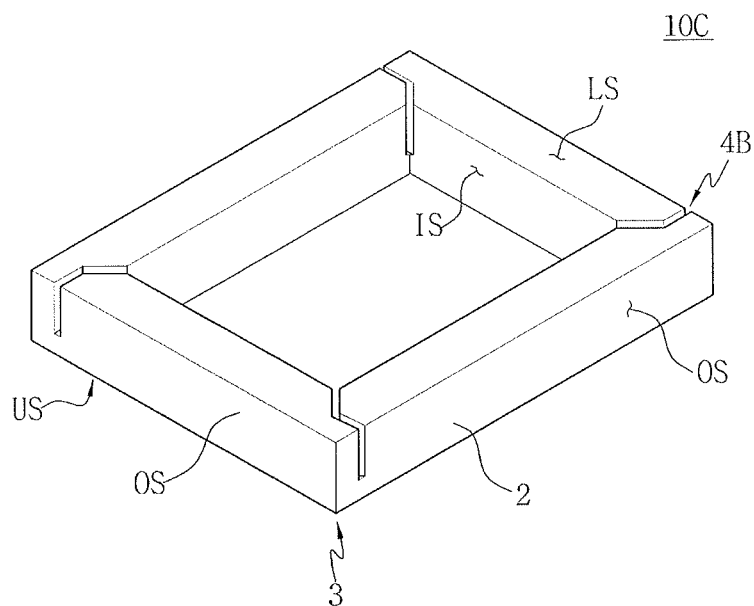

FIG. 2C illustrates a perspective view of a frame 10C according to an embodiment.

Referring to FIG. 2C, the frame 10C may include second buffer zones 4B formed in corner portions 3 thereof. The second buffer zones 4B may be generally L-shaped slits or grooves. For example, the second buffer zones 4B may include a longitudinally formed portion and a laterally formed portion. The longitudinally formed portion and the laterally formed portion may not be perpendicular to each other. For example, the second buffer zone 4B may extend through an inner surface IS and an outer surface OS of the frame 10. According to some embodiments, the second buffer zone 4B may extend from an inner surface IS of the frame 10C, e.g., inner surface IS of an intersection of two adjacent ones of the sides 2, to the outer surface OS of the frame 10C, e.g., outer surface OS of one of the adjacent sides 2. Thus, an inner end portion of the second buffer zone 4B may extend to the inner surface IS and an outer end portion of the second buffer zone 4B may extend to the outer surface OS.

Outer end portions of the second buffer zones 4B may be perpendicular to an outer surface OS of the frame 10C. The second buffer zones 4B may replace portions of the inner surface IS, the outer surface OS and the lower surface LS of the corner portions 3. The second buffer zones 4B may not replace an upper surface US of the corner portions 3. The second buffer zones 4B may also be selectively formed only in one to three of the corner portions 3, e.g., no more than three of the corner portions 3.

Figure 2D:
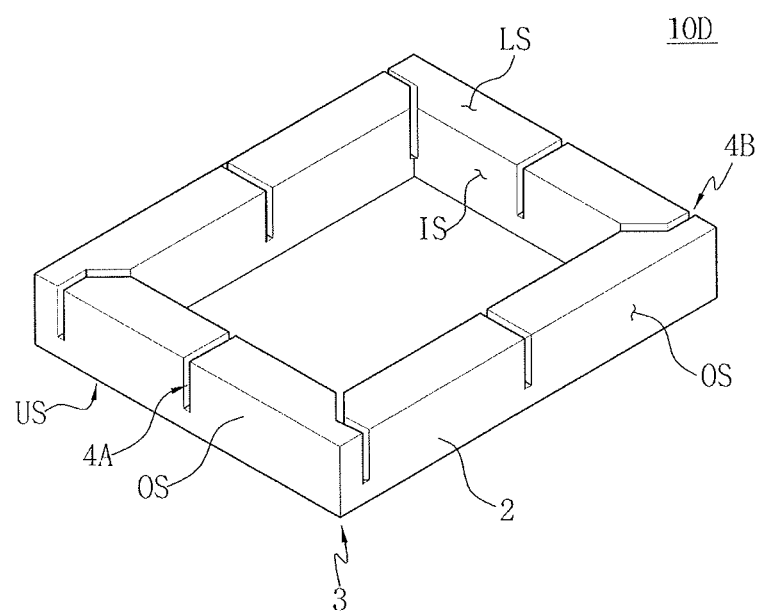

FIG. 2D illustrates a perspective view of a frame according to an embodiment.

Referring to FIG. 2D, a frame 10D may include first buffer zones 4A formed in sides 2, and second buffer zones 4B formed in corner portions 3. As described above, the first buffer zones 4A may be 'I'-shaped slits, as shown in FIG. 2A, and the second buffer zones 4B may be generally 'L'-shaped slits, as shown in FIG. 2C. The first buffer zones 4A may be selectively formed in one or more of the sides 2, and the second buffer zones 4B may be formed in one or more of the corner portions 3. In an implementation, the first buffer zones 4A may be selectively formed only in one to three of the sides 2, e.g., no more than three sides, and the second buffer zones 4B may be selectively formed only in one to three of the corner portions 3, e.g., no more than three of the corner portions 3.

Figure 2E:
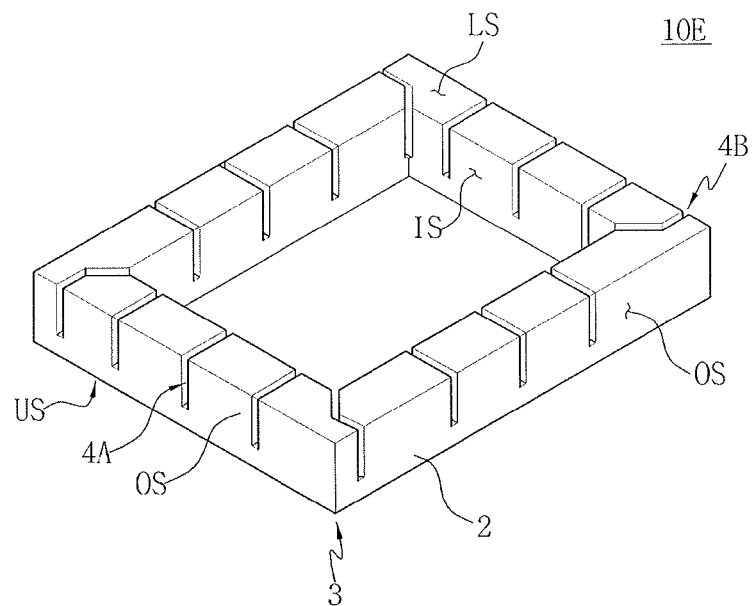

FIG. 2E illustrates a perspective view of a frame 10E according to an embodiment.

Referring to FIG. 2E, the frame 10E may include two or more first buffer zones 4A in each of sides 2, and second buffer zones 4B formed in corner portions 3. The first buffer zones 4A may be selectively formed in one or more of the sides 2, and the second buffer zones 4B may be selectively formed in or more of the corner portions 3. For example, the first buffer zones 4A may be selectively formed only in one to three of the sides 2, e.g., no more than three sides 2, and the second buffer zones 4B may be selectively formed only in one to three of the corner portions 3, e.g., no more than three corner portions 3.

Figure 2F:
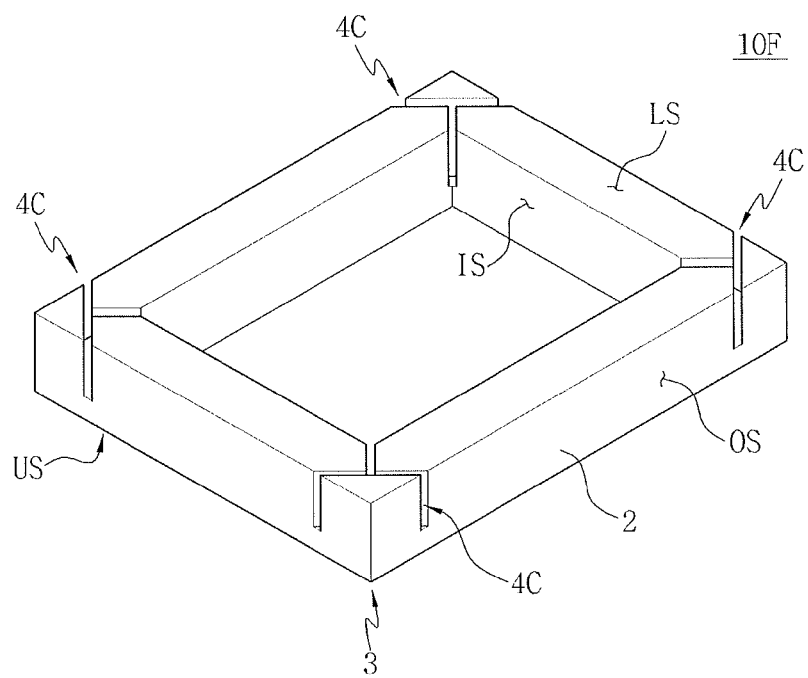

FIG. 2F illustrates a perspective view of a frame 10F according to an embodiment.

Referring to FIG. 2F, the frame 10F may include third buffer zones 4C formed in corner portions 3. The third buffer zones 4C may be 'T'-shaped slits. The third buffer zones 4C may include a longitudinally formed portion and a laterally formed portion. Outer end portions of the third buffer zones 4C may be perpendicular to outer surfaces OS of the corresponding sides 2. The third buffer zones 4C may be selectively formed in one or more of the corner portions 3. In an implementation, the third buffer zones 4C may be selectively formed only in one to three of the corner portions 3, e.g., no more than three corner portions 3. For example, the second buffer zone 4B may extend through an inner surface IS and outer surfaces OS of the frame 10F, e.g., from an intersection of two adjacent ones of the sides 2 to outer surfaces of both of the adjacent sides 2.

Figure 2G:
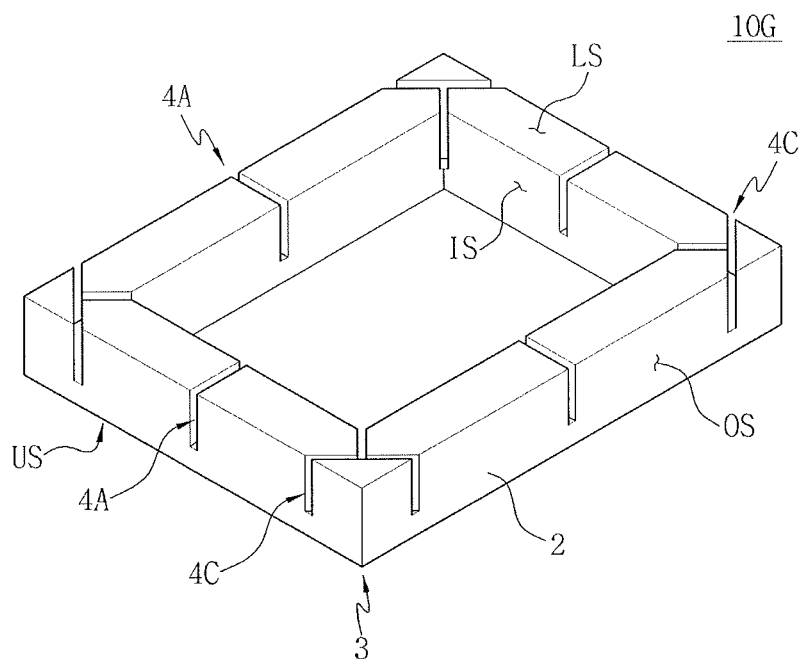

FIG. 2G illustrates a perspective view of a frame 10G according to an embodiment.

Referring to FIG. 2G, the frame 10G may include first buffer zones 4A respectively formed in sides 2, and third buffer zones 4C respectively formed in corner portions 3. For example each of the sides 2 may be divided into two portions by the first buffer zones 4A. The first buffer zones 4A may be selectively formed only in one to three of the sides 2, e.g., no more than three of the sides 2, and the third buffer zones 4C may be selectively formed only in one to three of the corner portions 3, e.g., no more than three corner portions 3.

Figure 2H:
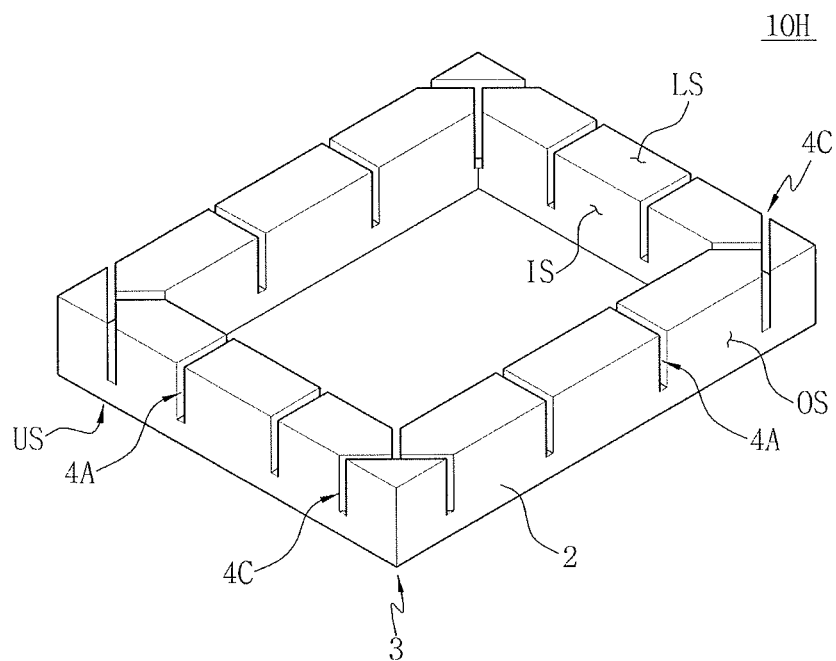

FIG. 2H illustrates a perspective view of a frame 10H according to an embodiment.

Referring to FIG. 2H, the frame 10H may include a plurality of first buffer zones 4A formed in each of sides 2, and third buffer zones 4C formed in corner portions 3. For example, each of the sides 2 may be divided into three or more portions by the first buffer zones 4A. The first buffer zones 4A may be selectively formed only in one to three of the sides 2, e.g., no more than three of the sides 2, and the third buffer zones 4C may be selectively formed only in one to three of the corner portions 3, e.g., no more than three of the corner portions 3.

Figure 2I:
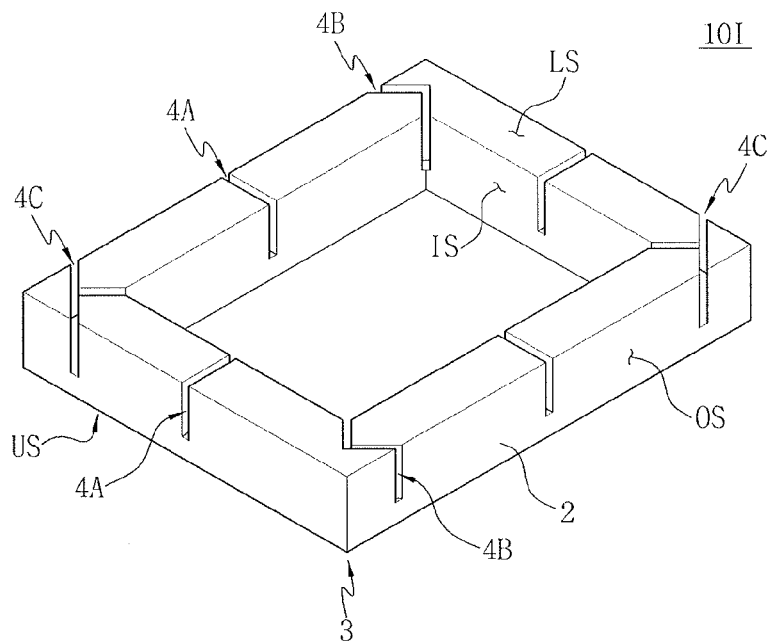

FIG. 2I illustrates a perspective view of a frame 10I according to an embodiment.

Referring to FIG. 2I, the frame 10I may include first buffer zones 4A respectively formed in sides 2, and second and third buffer zones 4B and 4C formed in corner portions 3. For example, each of the sides 2 may be divided into two portions by the first buffer zones 4A. In this case, the first buffer zones 4A may be selectively formed only in one to three of the sides 2, e.g., no more than three of the sides 2, and the second or third buffer zones 4B or 4C may be selectively formed only in one to three of the corner portions 3, e.g., no more than three of the corner portions 3, so that the first buffer zones 4A, the second buffer zones 4B, and the third buffer zones 4C may all be defined in the frame 10I.

Figure 2J:
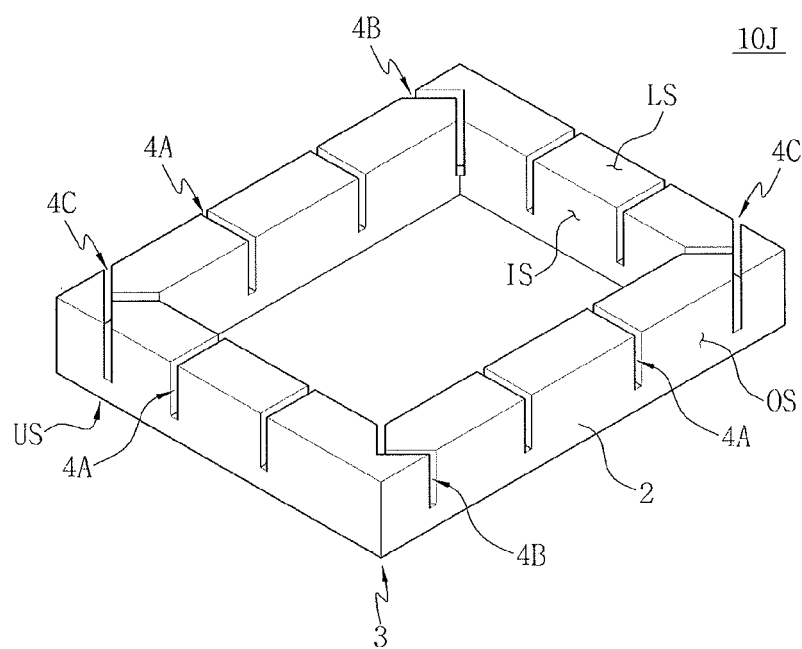

FIG. 2J illustrates a perspective view of a frame 10J according to an embodiment.

Referring to FIG. 2J, the frame 10J may include a plurality of first buffer zones 4A formed in each of sides 2, and second and third buffer zones 4B and 4C formed in corner portions 3. For example, each of the sides 2 may be divided into three or more portions by the first buffer zones 4A. Each of the frames 10A to 10J of FIGS. 2A to 2J may selectively include the first to third buffer zones 4A to 4C.

The first to third buffer zones 4A to 4C may provide an air path connecting an interior and an exterior of each of the frames 10A to 10J, thereby effectively emitting heat from the interior of the frames 10A to 10J of the photomask structure according to embodiments (shown in FIG. 1A, for example). Once portions of the inner surface IS and the outer surface OS of the frames 10A to 10J are open, transformation and/or damage of the membrane 18 and the pellicle 40 in FIG. 1B (due to differences in atmospheric pressure and/or temperature, etc. between the interior and the exterior of the frames 10A to 10J) may be prevented and relieved.

The first to third buffer zones 4A to 4C may divide the lower surfaces LS of the sides 2 and/or the corner portions 3 of the frames 10A to 10J into a plurality of portions, and provide flexibility to the frames 10A to 10J, thereby dispersing pressure applied to a surface of the photomask 44 of FIG. 1A by the frames 10A to 10J. The pellicle 40 and/or the photomask structure 50 of FIG. 1A, including any one of the frames 10A to 10J, according to various embodiments may help prevent and relieve deterioration in evenness of the surface of the photomask 44 due to pressure from the frames 10A to 10J.

The frames 10A to 10J of the pellicle 40 and/or the photomask structure 50, according to various embodiments, may fully adhere to the surface of the photomask 44, and may seal a portion of the surface of the photomask 44.

FIG. 3A illustrates a perspective view of a frame 20A according to an embodiment.

Referring to FIG. 3A, the frame 20A may include a through hole 8 and fourth buffer zones 6A formed in sides 2 thereof. Each of the sides 2 may include a plurality of fourth buffer zones 6A. The fourth buffer zones 6A may be groove-type buffer zones 4. In the embodiment illustrated in FIG. 3A, although one through hole 8 is shown in one of the sides 2, a plurality of through holes 8 may be formed in the one side 2. Alternatively, one or more through holes 8 may be formed in each of the sides 2.

The through hole 8 may provide an air path connecting an interior surface and an exterior surface of the frame 20A. The through hole 8 may be omitted if the slit-type buffer zones 4 shown in FIGS. 2A to 2J are formed in the frames 10A to 10J. The fourth buffer zones 6A may be grooves in an outer surface OS of the sides 2. The fourth buffer zones 6A may replace portions of the outer surface OS and/or a lower surface LS of the sides 2.

The fourth buffer zones 6A may not connect the interior and exterior of the frame 20A together, unlike the first to third buffer zones 4A to 4C in FIGS. 2A to 2J. Also, the fourth buffer zones 6A may partially divide the sides 2 into a plurality of portions, similar to the first to third buffer zones 4A to 4C. The fourth buffer zones 6A may be selectively formed in one to three of the sides 2, e.g., no more than three of the sides 2.

Figure 3B:
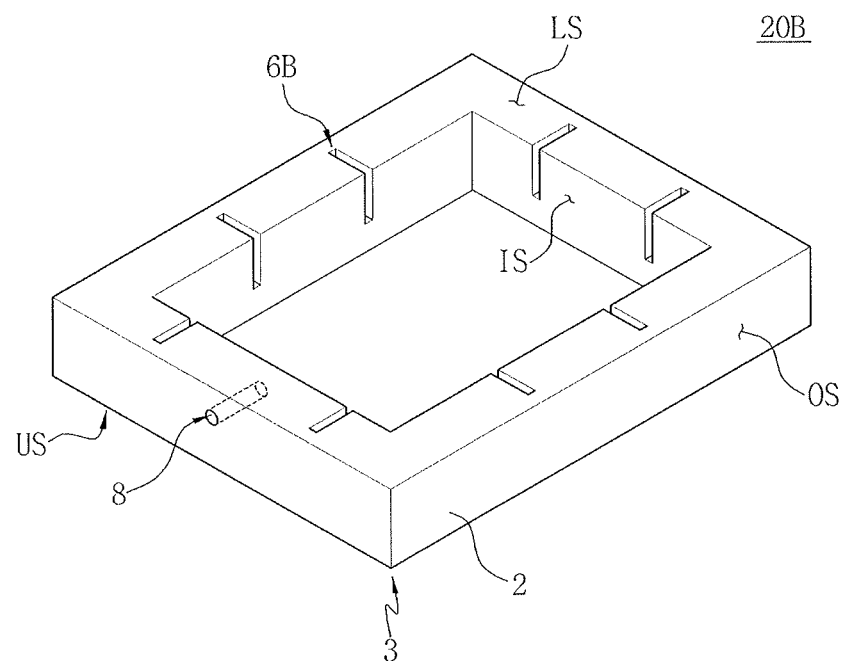

FIG. 3B illustrates a perspective view of a frame 20B according to an embodiment.

Referring to FIG. 3B, the frame 20B may include a through hole 8 and fifth buffer zones 6B formed in sides 2. The fifth buffer zones 6B may be grooves in an inner surface IS of the sides 2. The fifth buffer zones 6B may replace portions of the inner surface IS and a lower surface LS of the sides 2. Other elements of the frame 20B may be similar to the frame 20A, shown in FIG. 3A.

Figure 3C:
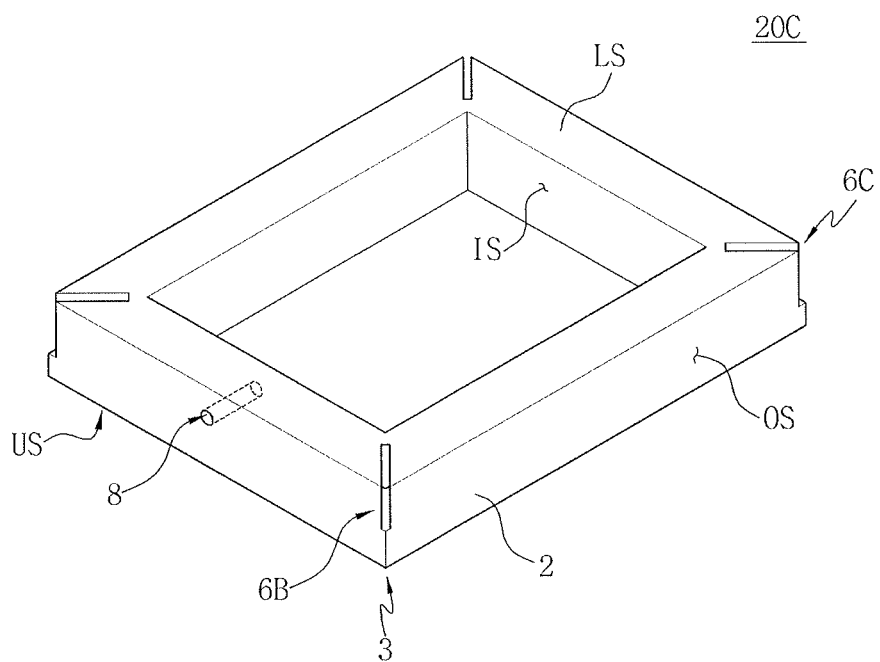

FIG. 3C illustrates a perspective view of a frame 20C according to an embodiment.

Referring to FIG. 3C, the frame 20C may include a through hole 8 in one of sides 2, and sixth buffer zones 6C respectively formed in corner portions 3. Outer end portions of the sixth buffer zones 6C may be defined within corners of the frame 20C. The sixth buffer zones 6C may be grooves in an outer surface OS of the corner portions 3. For example, the sixth buffer zones 6C may be line-shaped, generally 'L'-shaped or 'T'-shaped grooves. The sixth buffer zones 6C may also be 'L'-shaped slits, as shown in FIG. 2C, or 'T'-shaped slits, as shown in FIG. 2F.

In an implementation, the sixth buffer zones 6C may be selectively formed in one to three of the corner portions 3, e.g., no more than three of the corner portions 3. Other elements of the frame 20C may be similar to the frame 20a, shown in FIG. 3A, and the frame 20B, shown in FIG. 3B.

Figure 3D:
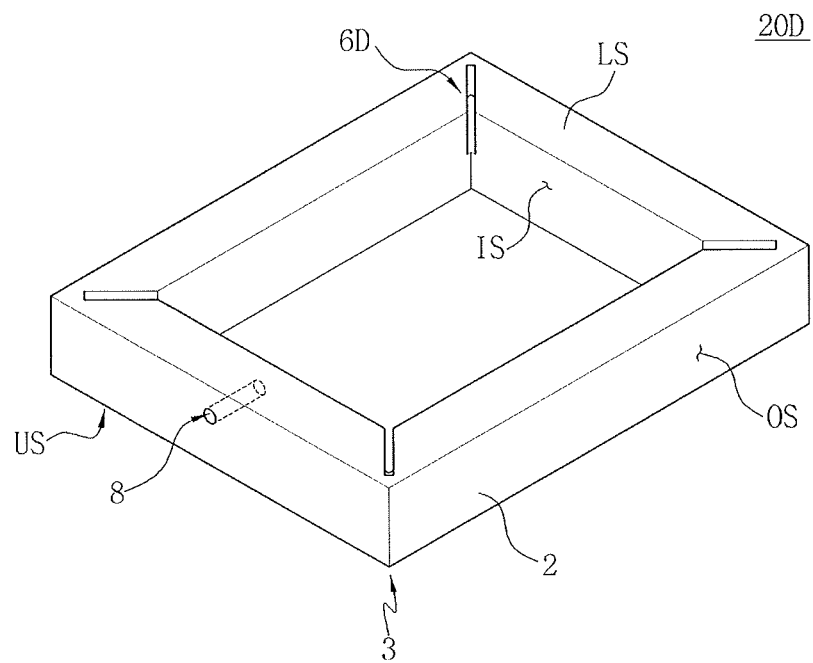

FIG. 3D illustrates a perspective view of a frame 20D according to an embodiment.

Referring to FIG. 3D, the frame 20D may include a through hole 8 in one of sides 2, and seventh buffer zones 6D in corner portions 3. The seventh buffer zones 6D may be grooves in an inner surface IS of the corner portions 3. End portions of the seventh buffer zones 6D may be defined within corners of the frame 20D. Other elements of the frame 20D may be similar to the frames 20A-20C, shown in FIGS. 3A to 3C, respectively.

Figure 3E:
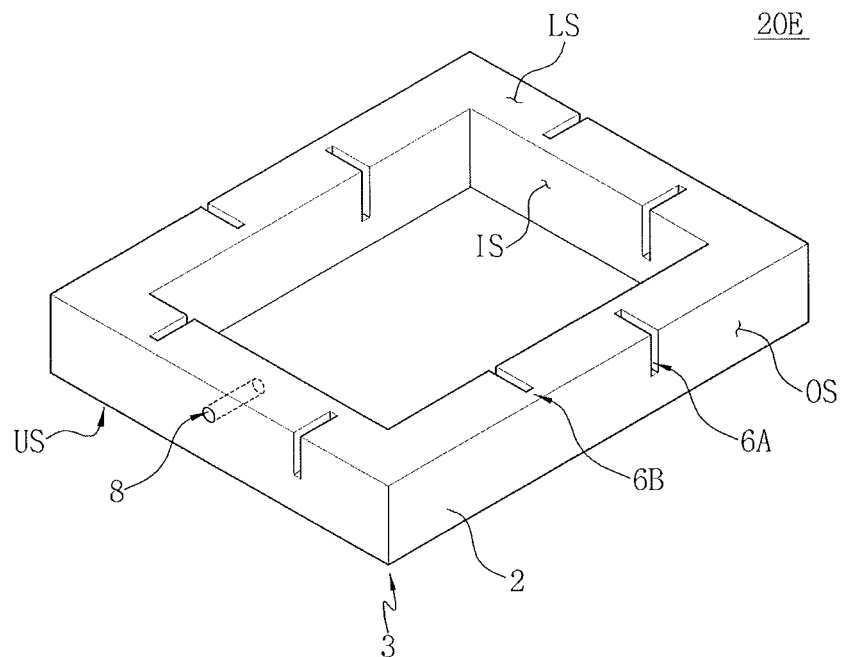

FIG. 3E illustrates a perspective view of a frame 20E according to an embodiment.

Referring to FIG. 3E, the frame 20E may include a through hole 8, fourth buffer zones 6A and fifth buffer zones 6B formed in sides 2. Other elements of the frame 20E may be similar to the frames 20A-20B, shown in FIGS. 3A and 3B, respectively.

Figure 3F:
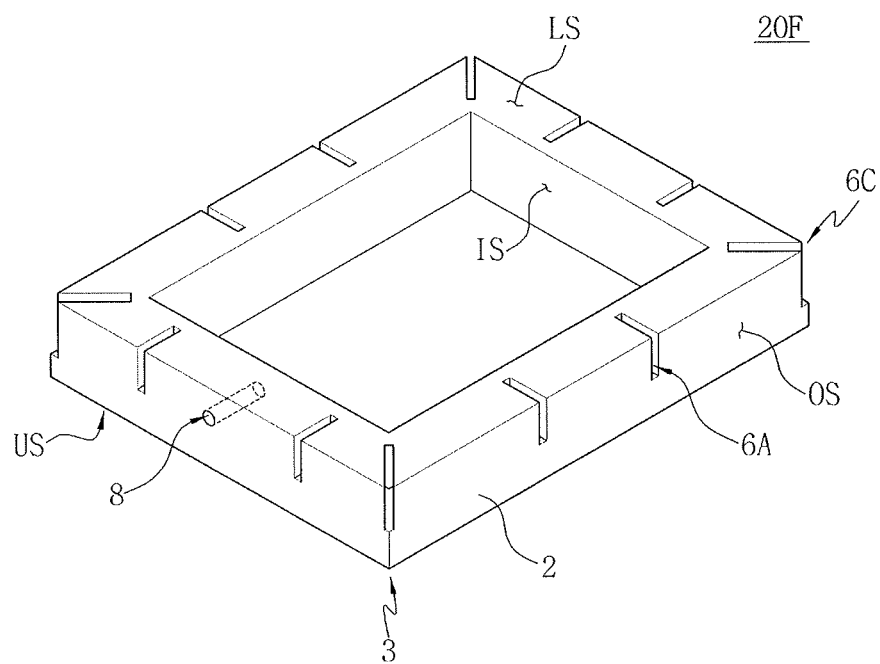

FIG. 3F illustrates a perspective view of a frame 20F according to an embodiment.

Referring to FIG. 3F, the frame 20F may include a through hole 8 and fourth buffer zones 6A formed in sides 2 and sixth buffer zones 6C formed in corner portions 3. Other elements of the frame 20F may be similar to the frames 20A-20C, shown in FIGS. 3A and 3C, respectively.

Figure 3G:
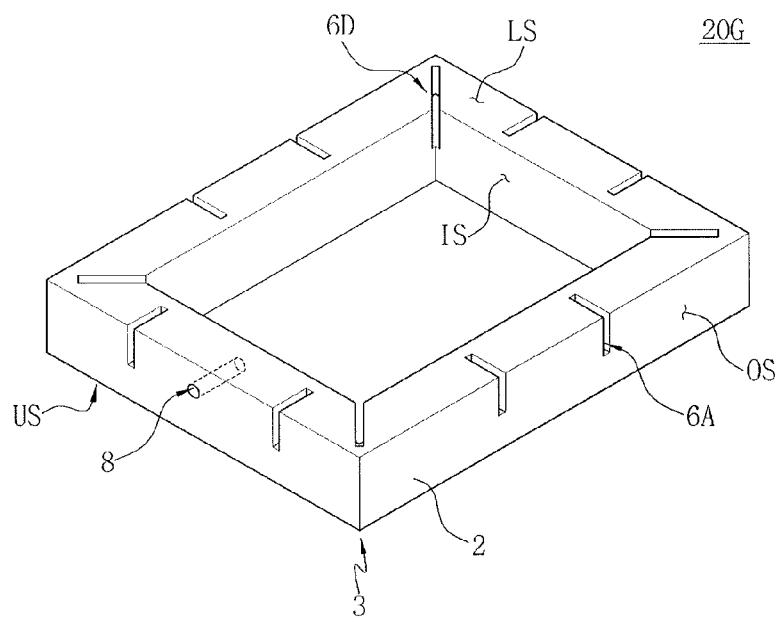

FIG. 3G illustrates a perspective view of a frame 20G according to an embodiment.

Referring to FIG. 3G, the frame 20G may include a through hole 8 and fourth buffer zones 6A formed in sides 2, and seventh buffer zones 6D formed in corner portions 3. Other elements of the frame 20G may be similar to the frames 20A-20D, shown in FIGS. 3A and 3D, respectively.

Figure 3H:
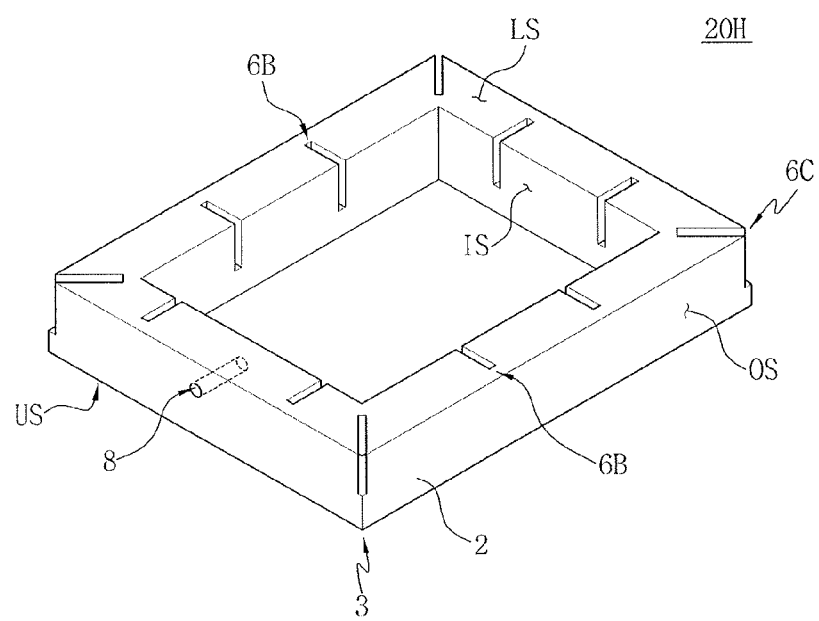

FIG. 3H illustrates a perspective view of a frame 20H according to an embodiment.

Referring to FIG. 3H, the frame 20H may include a through hole 8, fifth buffer zones 6B formed in sides 2, and sixth buffer zones 6C formed in corner portions 3. Other elements of the frame 20H may be similar to the frames 20B-20C, shown in FIGS. 3B and 3C, respectively.

Figure 3I:
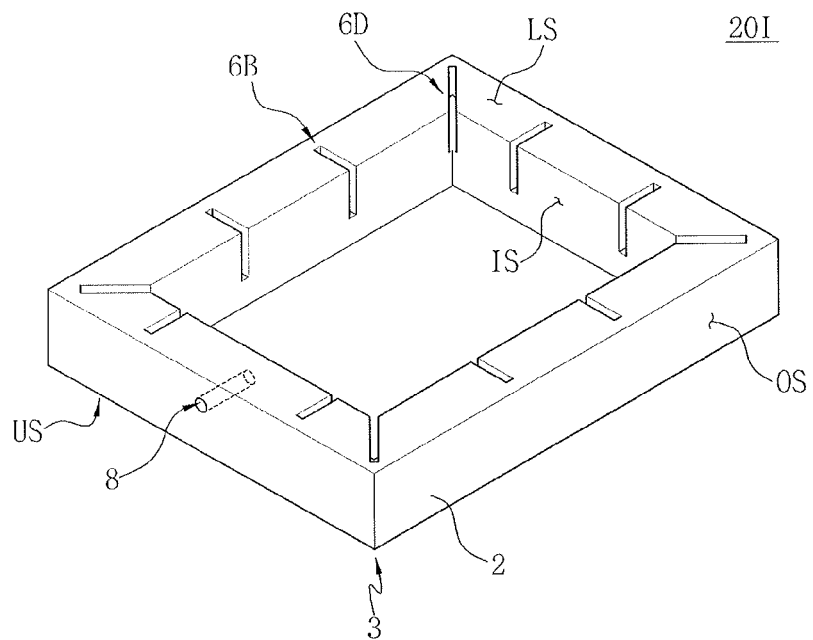

FIG. 3I illustrates a perspective view of a frame 20I according to an embodiment.

Referring to FIG. 3I, the frame 20I may include a through hole 8, fifth buffer zones 6B formed in sides 2, and seventh buffer zones 6D formed in corner portions 3. Other elements of the frame 20I may be similar to the frames 20B-20C, shown in FIGS. 3B and 3C, respectively.

Figure 3J:
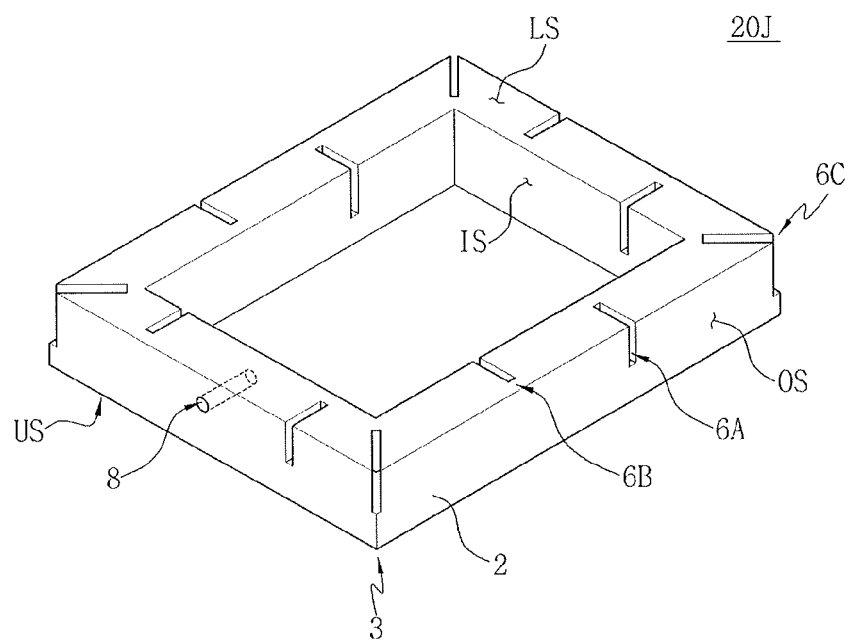

FIG. 3J illustrates a perspective view showing a frame 20J according to an embodiment.

Referring to FIG. 3J, the frame 20J may include a through hole 8, fourth and fifth buffer zones 6A and 6B formed in sides 2, and sixth buffer zones 6C formed in corner portions 3. Other elements of the frame 20J may be similar to the frames 20A-20C, shown in FIGS. 3A to 3C, respectively.

Figure 3K:
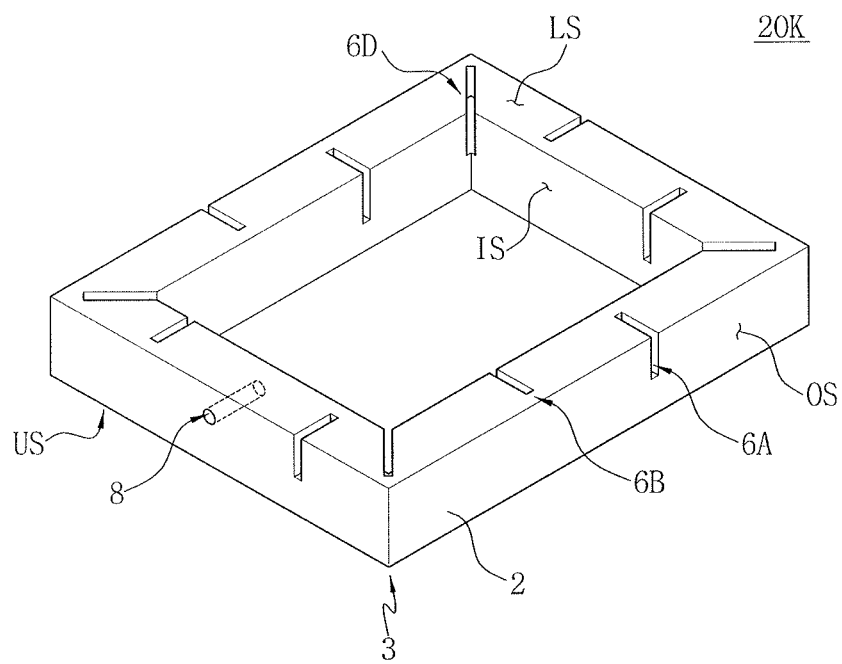

FIG. 3K illustrates a perspective view of a frame 20K according to an embodiment.

Referring to FIG. 3K, the frame 20K may include a through hole 8, fourth and fifth buffer zones 6A and 6B formed in sides 2, and seventh buffer zones 6D formed in corner portions 3. Other elements of the frame 20K may be similar to the frames 20A, 20B, and 20D, shown in FIGS. 3A, 3B and 3D, respectively.

Figure 3L:
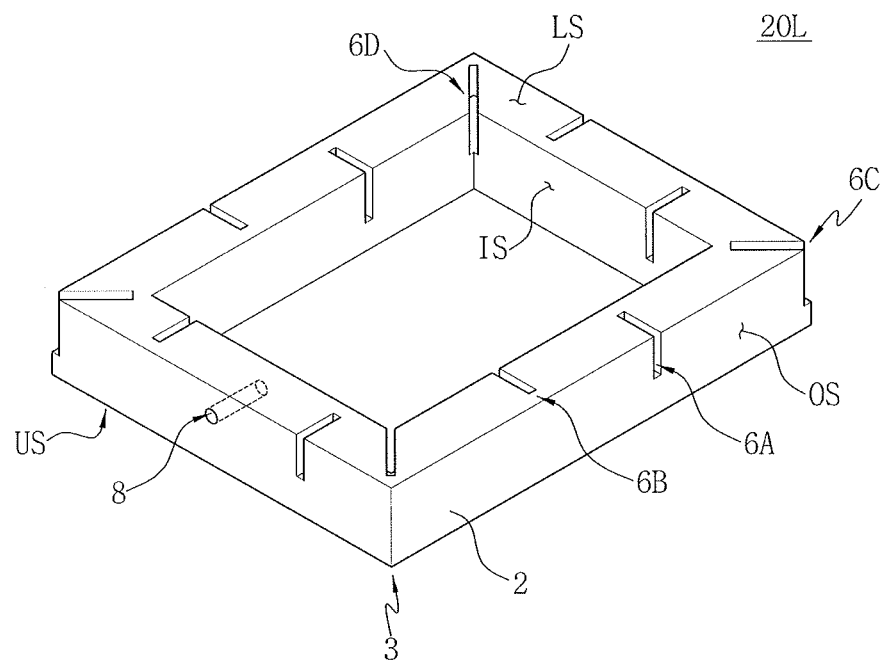

FIG. 3L illustrates a perspective view of a frame 20L according to an embodiment.

Referring to FIG. 3L, the frame 20L may include a through hole 8, fourth and fifth buffer zones 6A and 6B, and sixth and seventh buffer zones 6C and 6D formed in corner portions 3. Other elements of the frame 20L may be similar to the frames 20A-20D, shown in FIGS. 3A to 3D, respectively.

Each of the various frames 20A to 20L, shown and described in FIGS. 3A to 3L, may selectively include the through hole 8 and the fourth to seventh buffer zones 6A to 6D. The fourth to seventh buffer zones 6A to 6D may divide the lower surface LS of the sides 2 and/or the corner portions 3 of each of the frames 20A to 20L into a plurality of portions, thereby making the frames 20A to 20L flexible.

According to some embodiments, the fourth to seventh buffer zones 6A to 6D may disperse pressure applied to the surface of the photomask of FIG. 1A by the frames 20A to 20L, thereby preventing or relieving deterioration of an evenness of the surface of the photomask 44. In addition, the fourth and sixth buffer zones 6A and/or 6C may partially divide the outer surface OS of the respective frame into a plurality of portions, and the fifth and seventh buffer zones 6B and/or 6D may partially divide the inner surface IS of the respective frame into a plurality of portions.

Technical features of the frames 10A to 10J, shown in FIGS. 2A to 2J, and the frames 20A to 20L, shown in FIGS. 3A to 3L, may be interchangeable.

Figure 4A:
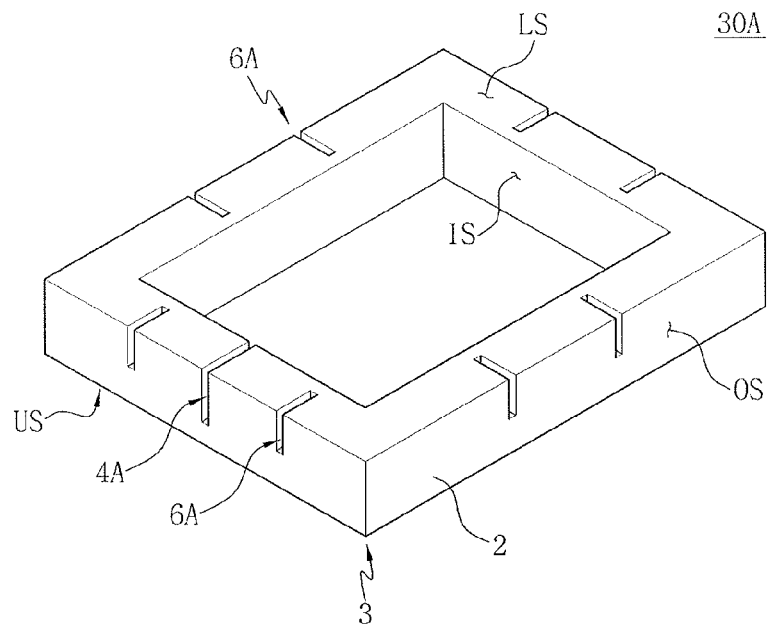

FIG. 4A illustrates a perspective view of a frame 30A according to an embodiment.

Referring to FIG. 4A, the frame 30A may include first buffer zones 4A and fourth buffer zones 6A formed in one or more of the sides 2. The first buffer zones 4A may be slit-type buffer zones and the fourth buffer zones 6A may be groove-type buffer zones. While one first buffer zone 4A and two fourth buffer zones 6A are shown in a respective one of the sides 2, two or more of the first buffer zones 4A and the fourth buffer zones 6A may be selectively formed in each of the sides 2. Other elements of the frame 30A may be similar to the frames 10A and 20A, shown in FIGS. 2A and 3A, respectively.

Figure 4B:
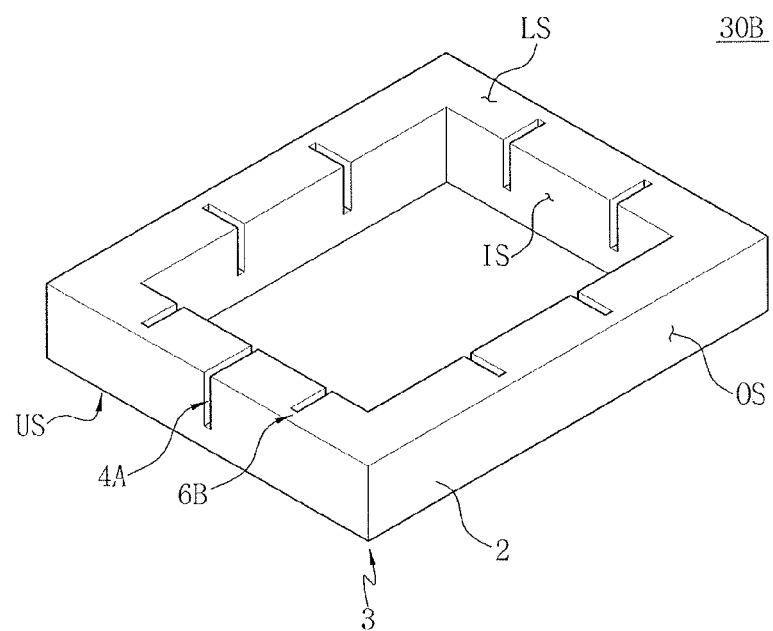

FIG. 4B illustrates a perspective view of the frame 30B according to an embodiment.

Referring to FIG. 4B, the frame 30B may include first buffer zone 4A and fifth buffer zones 6B formed in sides 2. While one first buffer zone 4A and two fifth buffer zones 6B are shown in one of the sides 2, two or more of the first buffer zone 4A and the fifth buffer zones 6B may be selectively formed in each of the sides 2. Other elements of the frame 30B may be similar to the frames 10A and 20B, shown in FIGS. 2A and 3B, respectively.

Figure 4C:
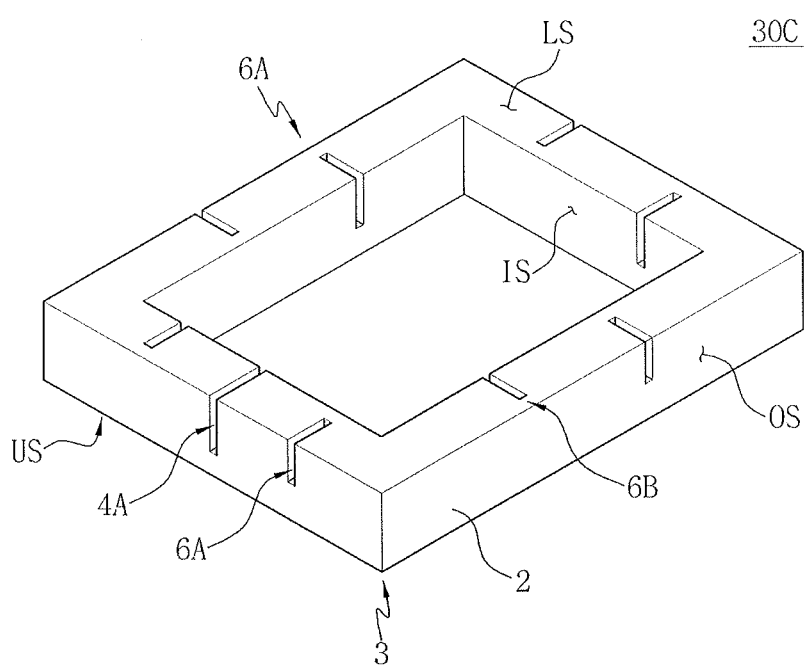

FIG. 4C illustrates a perspective view of a frame 30C according to an embodiment.

Referring to FIG. 4C, the frame 30C may include first buffer zone 4A, fourth buffer zones 6A, and fifth buffer zones 6B formed in sides 2. While one first buffer zone 4A, one fourth buffer zone 6A, and one fifth buffer zone 6B is shown in one of the sides 2, two or more of each of the first buffer zone 4A, the fourth buffer zone 6A and the fifth buffer zone 6B may be selectively formed in each of the sides 2. Other elements of the frame 30B may be similar to the frames 10A and 20H, shown in FIGS. 2A and 3H, respectively.

Each of the various frames 30A to 30C, shown and described in FIGS. 4A to 4C, may selectively include the first buffer zone 4A, the fourth buffer zones 6A and the fifth buffer zones 6B. The first, fourth and fifth buffer zones 4A, 6A and 6B may divide a lower surface LS, an inner surface IS and an outer surface OS of the sides 2 of each of the frames 30A to 30C into a plurality of portions, thereby making the frames 30A to 30C flexible.

According to some embodiments, the first, fourth and fifth buffer zones 4A, 6A and 6B may disperse pressure applied to the surface of the photomask of FIG. 1A by the frames 30A to 30C, thereby preventing or relieving deterioration of evenness of the surface of the photomask 44. Technical features of the frames 10A to 10J, 20A to 20L and 30A to 30C, shown in FIGS. 2A to 2J, 3A to 3L and 4A to 4C may be interchangeable.

Except with respect to the frames 10A to 10J, 20A to 20L and 30A to 30C of the embodiments described above, the first to seventh buffer zones 4A to 4C and 6A to 6D and the through hole 8 may be provided separately or in combination in the frames according to embodiments. Thus, although not specifically shown in the drawings, one or more embodiments may include a frame in which first to seventh buffer zones 4A to 4C and 6A to 6D and the through hole 8 are combined variously to be formed in one or more sides 2 and one or more corner portions 3.

Figure 5A:
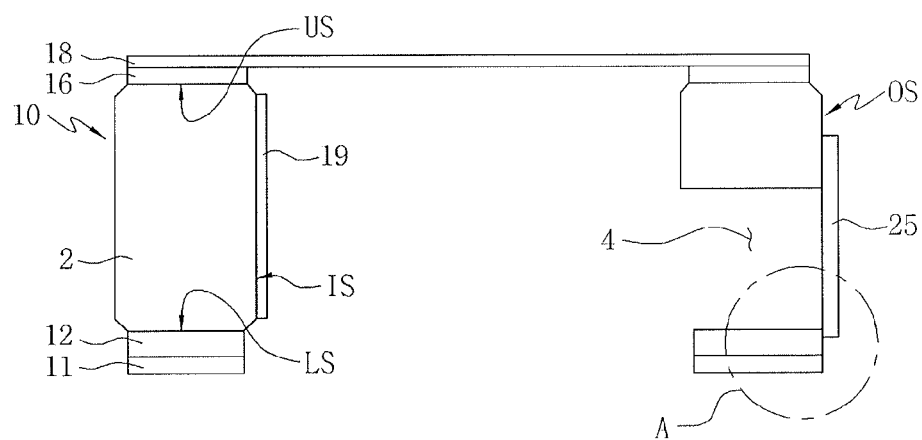
FIGS. 5A to 5C illustrate longitudinal sections of pellicles according to an embodiment.
Figure 5B:
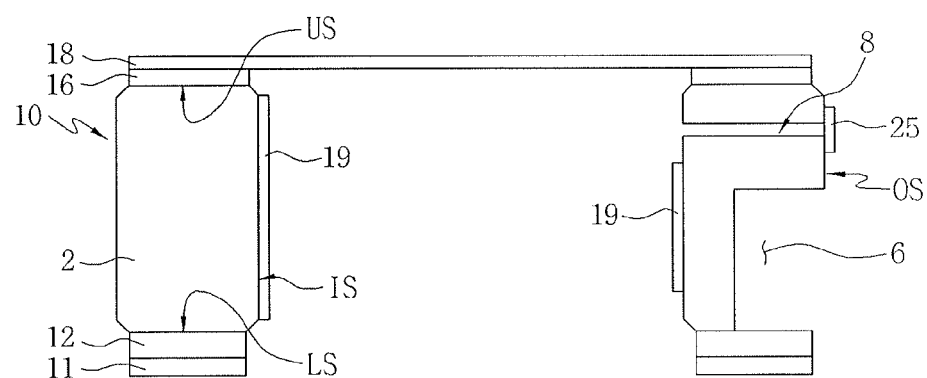
Figure 5C:
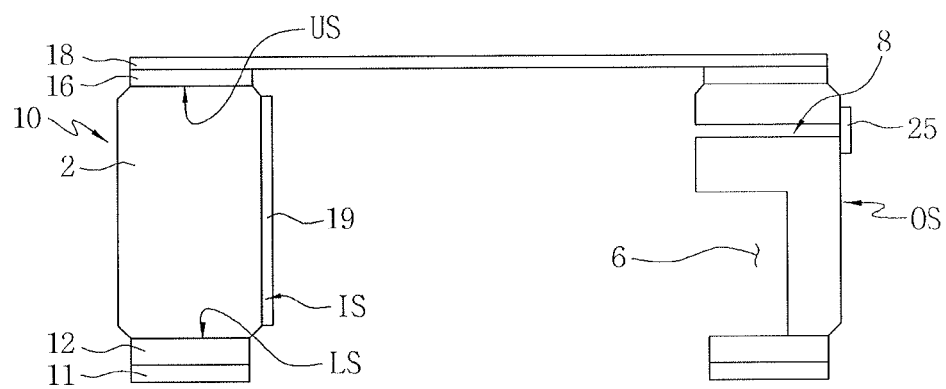

FIGS. 5A to 5C illustrate longitudinal sections showing pellicles 40A to 40C according to an embodiment.

Referring to FIG. 5A, the pellicle 40A may include a lower adhesive member 12 on a lower surface LS of a frame 10, an upper adhesive member 16 on an upper surface US of the frame 10, a membrane 18 on the upper adhesive member 16, and a slit-type buffer zone 4 in the frame 10. Thus, the slit-type buffer zone 4 may connect an interior and an exterior surface of the frame 10.

The slit-type buffer zone 4 may be in one of the sides 2 of the frame 10 in the figure, or in the remaining sides 2 or corner portions of the frame 10 (not shown). A lower portion of the slit-type buffer zone 4 may be blocked by the lower adhesive member 12. The pellicle 40A may further include a liner 11 under the lower adhesive member 12.

The liner 11 may be a film for protecting the lower adhesive member 12, and may be removed when the pellicle 40A is detached from the photomask 44 of FIG. 1A. The pellicle 40A may further include a capturing film 19 formed on an inner surface IS of the frame 10. The capturing film 19 may be provided as an adhesive film or a paste-type substance. The capturing film 19 may capture a particle, for example, within the pellicle 40A.

The pellicle 40A may include a filter 25 in order to cover the slit-type buffer zone 4 on an outer surface OS of the frame 10. As described in FIGS. 1A and 1B, the filters 25 may prevent a particle, for example, from flowing through the slit-type buffer zone 4, from the exterior of the pellicle 40A toward the interior of the pellicle 40A.

Referring to FIG. 5B, a pellicle 40B may include a groove-type buffer zone 6 in an outer surface OS of a frame 10. The groove-type buffer zone 6 may be formed in a respective one of the sides 2 of the frame 10, or in a respective one of the corner portions 3 (not shown). The groove-type buffer zone 6 may not connect an interior and an exterior of the pellicle 40B.

Thus, the groove-type buffer zone 6 may not be covered with the filter 25 of FIG. 5A. The pellicle 40B may include a through hole 8. The through hole 8 may be covered with the filter 25. The through hole 8 and the filter 25 are shown in FIG. 5B.

Referring to FIG. 5C, a frame 40C may include a groove-type buffer zone 6 in an inner surface IS of a frame 10. The groove-type buffer zone 6 may be formed in a respective one of the sides 2 of the frame 10, or in a respective one of the corner portions 3 (not shown). The groove-type buffer zone 6 may not connect an interior and an exterior of the pellicle 40C.

Thus, the groove-type buffer zone 6 may not be covered with the filter 25 of FIG. 5A. The pellicle 40C may include a through hole 8. The pellicles 40A to 40C, exemplified in FIGS. 5A to 5C, may include one of the frames 10A to 10J, 20A to 20L and 30A to 30C, exemplified in FIGS. 2A to 2J, 3A to 3L and 4A to 4C.

Figure 6:
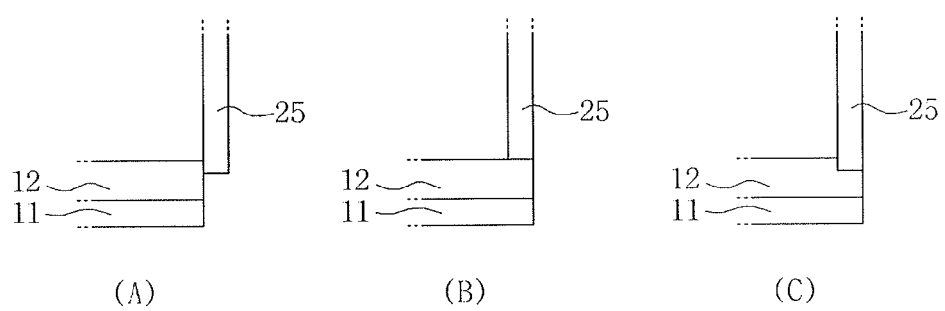
FIG. 6(A) illustrates an interconnection of a filter and a lower adhesive member shown in region 'A' of FIG. 5A according to an embodiment.
FIG. 6(B) illustrates an interconnection of a filter and a lower adhesive member shown in region 'A' of FIG. 5A according to an embodiment.
FIG. 6(C) illustrates an interconnection of a filter and a lower adhesive member shown in region 'A' of FIG. 5A according to an embodiment.

FIG. 6(A) illustrates an interconnection of a filter and a lower adhesive member shown in region 'A' of FIG. 5A according to an embodiment. FIG. 6(B) illustrates an interconnection of a filter and a lower adhesive member shown in region 'A' of FIG. 5A according to an embodiment. FIG. 6(C) illustrates an interconnection of a filter and a lower adhesive member shown in region 'A' of FIG. 5A according to an embodiment.

Referring to FIG. 6(A), an inside surface of the filter 25 may contact a side surface of the lower adhesive member 12 in region 'A' of FIG. 5A.

Referring to FIG. 6(B), a lower surface of the filter 25 may contact a top surface of the lower adhesive member 12 in region 'A' of FIG. 5A.

Referring FIG. 6(C), an inside surface and a lower surface of a filter may contact an outside surface and an upper surface of a lower adhesive member 12 in region 'A' of FIG. 5A.

Figure 7:
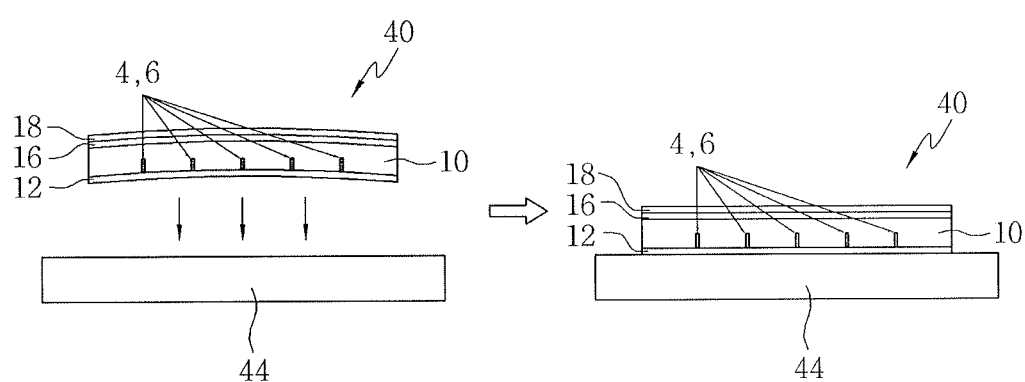
FIG. 7 illustrates a side view showing a non-deteriorated evenness of a photomask substrate according to an embodiment.

FIG. 7 illustrates a side view showing a non-deteriorated evenness of a photomask according to an embodiment.

Referring to FIG. 7, although the surface of the frame 10 of the pellicle 40 may be uneven, the frame 10 mounted on the photomask 44 may not influence the evenness of a surface of the photomask 44. The slit-type buffer zones 4 and/or groove-type buffer zones 6 may help provide flexibility to the frame 10, and may help prevent the photomask 44 from being impacted or affected by the unevenness of the frame 10.

Although FIG. 7 shows a plurality of slit-type buffer zones 4 and/or groove-type buffer zones 4 in the frame 10, the frame 10 may include one slit-type buffer zone 4 and/or one groove-type buffer zone 6.

Figure 8:
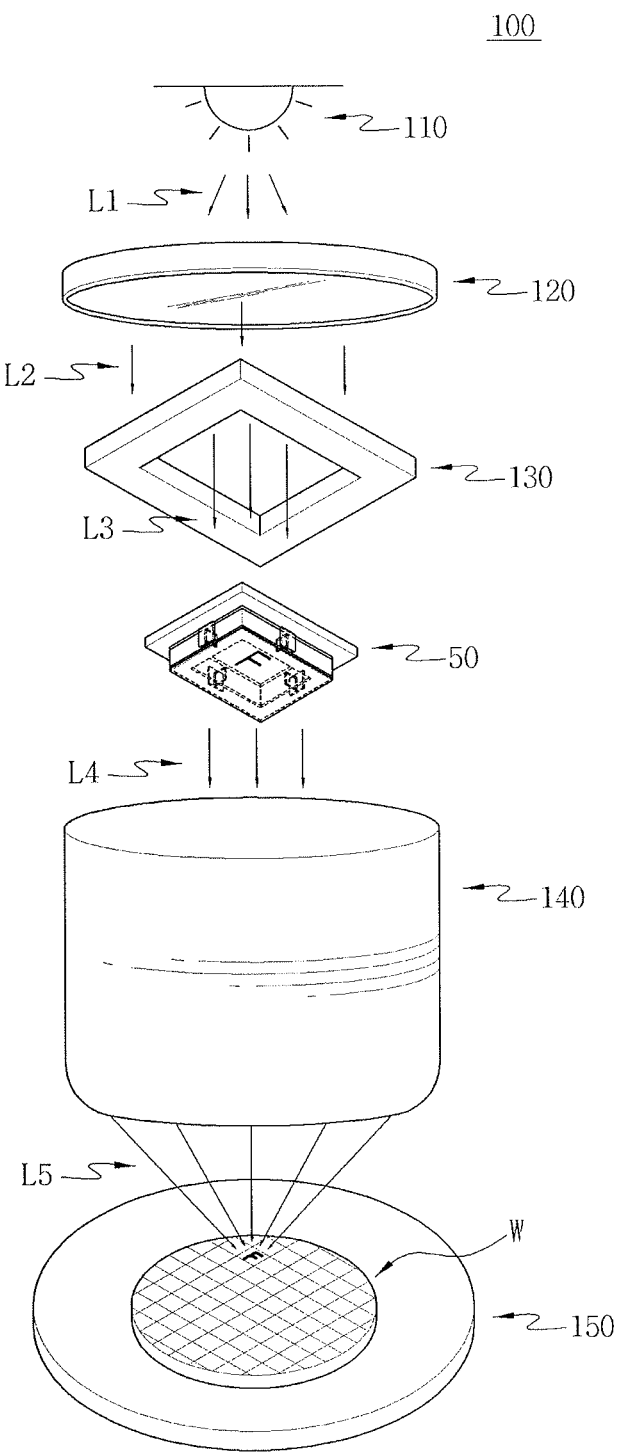
FIG. 8 illustrates an exploded perspective view showing a photolithographic apparatus that includes a photomask structure having a frame according to an embodiment.

FIG. 8 illustrates an exploded perspective view of a photolithographic apparatus 100, which may include a photomask structure 50 having any one of frames 10A to 10J, 20A to 20C, and 30A to 30E, according to an embodiment.

Referring to FIG. 8, the photolithographic apparatus 100 may include a light source 110, a relay lens 120, a blind 130, the photomask structure 50, a projection lens 140 and a wafer stage 150. A wafer W may be mounted on the wafer stage 150. Light L1 from the light source 110 may be irradiated to the relay lens 120. Light L2 transmitted from the relay lens 120 may be irradiated to the blind 130.

The blind 130 may selectively allow the light L2 to pass therethrough. Light L3 selectively passing through the blind 130 may be irradiated to the photomask structure 50. Light L4 transmitted from the photomask structure 50 may be irradiated to the projection lens 140. The light L4 may include optical pattern information of the photomask structure 50. Light L5 transmitted from the projection lens 140 may be focused on the wafer W, which is mounted on the wafer stage 150.

The focused wafer W may receive the optical pattern information to be exposed. According to an embodiment, the photomask 44 of FIG. 1A or 7 provided in the photomask structure 50 may have good evenness, e.g., sufficient evenness to allow the optical pattern transferred on the wafer W to have uniformity.

As described above, a pellicle according to an embodiment may include a frame having a buffer zone, thereby providing flexibility in the frame.

A pellicle according to an embodiment, including the frame having a buffer zone, may disperse pressure applied to a surface of a photomask from the frame.

A pellicle having a buffer zone that is mounted on the photomask, according to an embodiment, may help prevent or relieve deterioration of evenness of a surface of the photomask.

The photomask having the pellicle mounted thereon, according to an embodiment, may have a surface with good evenness, thereby allowing an optical pattern thereon to be uniform.

A photomask according to an embodiment may have a uniform optical pattern thereon due to the pellicle (having the buffer zone) mounted thereon, and may thereby allow a material pattern on a wafer to be uniformly formed.

A photomask according to an embodiment may have the pellicle (having the buffer zone) mounted thereon, and may thereby allow a depth of focus in a photolithographic process to be increased.

According to one or more embodiments a frame of a pellicle may be flexible. A lower surface of the frame may be divided into a plurality of portions. Pressure exerted by the frame to a surface of a photomask may be dispersed. The surface of the photomask may have a good evenness. An optical pattern of the photomask may have good uniformity. The photomask may have a physical pattern formed on a wafer having good uniformity. The photomask may have an increased depth of focus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pellicle, comprising:
   a frame having a square shape; and
   a slit-type buffer zone in the frame, the slit-type buffer zone dividing a lower surface of the frame into a plurality of portions,
   wherein the slit-type buffer zone penetrates from an inner surface to an outer surface of the frame,
   wherein the vertical height of the slit-type buffer zone is greater than a half of the vertical height of the frame, and
   wherein the slit-type buffer zone is configured to impart flexibility to the frame.

2. The pellicle as claimed in claim 1, wherein the buffer zone includes an opening in a portion of the lower surface of the frame.

3. The pellicle as claimed in claim 2, wherein the buffer zone includes an opening in an outer surface of the frame.

4. The pellicle as claimed in claim 3, wherein the buffer zone includes an opening in an inner surface of the frame.

5. The pellicle as claimed in claim 2, wherein the opening of the buffer zone does not extend to an upper surface of the frame.

6. The pellicle as claimed in claim 1, wherein the buffer zone is in two or more sides of the frame.

7. The pellicle as claimed in claim 1, wherein the frame includes corner portions, the buffer zone being in at least one of the corner portions.

8. The pellicle as claimed in claim 7, wherein the buffer zone is in two or more of the corner portions.

9. The pellicle as claimed in claim 1, wherein the frame includes a through hole.

10. The pellicle as claimed in claim 1, wherein the buffer zone is I-shaped.

11. The pellicle as claimed in claim 1, further comprising:
    a lower adhesive member on the lower surface of the frame;
    an upper adhesive member on an upper surface of the frame; and
    a membrane on the upper adhesive member.

12. The pellicle as claimed in claim 1, further comprising:
    an adhesive capturing film, the capturing film being in an inner surface of the frame.

13. The pellicle as claimed in claim 1, further comprising a filter on an outer surface of the frame, the filter covering the buffer zone.

14. A photomask structure, comprising:
    a photomask including an optical pattern thereon; and
    a pellicle mounted on the photomask and covering the optical pattern, the pellicle including a frame and a slit-type buffer zone, the slit-type buffer zone having an opening in a lower surface of the frame,
    wherein the slit-type buffer zone penetrates from an inner surface to an outer surface of the frame,
    wherein the vertical height of the slit-type buffer zone is greater than a half of the vertical height of the frame, and
    wherein the slit-type buffer zone is configured to impart flexibility to the frame.

15. A pellicle, comprising:
    a substantially rectangular frame including a first pair of parallel sides and a second pair of parallel sides, the first pair of parallel sides and the second pair of parallel sides intersecting at corner portions; and
    one or more slit-type buffer zones in the frame, the one or more slit-type buffer zones including an opening in a lower surface of the frame,
    wherein the slit-type buffer zone penetrates from an inner surface to an outer surface of the frame,
    wherein the vertical height of the slit-type buffer zone is greater than a half of the vertical height of the frame, and
    wherein the one or more slit-type buffer zones are configured to impart flexibility to the frame.

16. The pellicle as claimed in claim 15, wherein the one or more buffer zones are in one or more sides of the frame.

17. The pellicle as claimed in claim 1, wherein the buffer zone is in a corner of the frame.

* * * * *